(12) United States Patent
Podlesny et al.

(10) Patent No.: US 6,323,688 B1
(45) Date of Patent: Nov. 27, 2001

(54) EFFICIENT HALF-CYCLE CLOCKING SCHEME FOR SELF-RESET CIRCUIT

(75) Inventors: Andrew V. Podlesny; Alexander V. Malshin, both of Moscow (RU)

(73) Assignee: Elbrus International Limited, George Town (KY)

( * ) Notice: Subject to any disclaimer, the term of this patent is extended or adjusted under 35 U.S.C. 154(b) by 0 days.

(21) Appl. No.: 09/520,498

(22) Filed: Mar. 8, 2000

Related U.S. Application Data

(60) Provisional application No. 60/123,379, filed on Mar. 8, 1999.

(51) Int. Cl.[7] .................................................. H03K 19/096
(52) U.S. Cl. ................................ 326/98; 326/93; 326/95; 326/97
(58) Field of Search .................................. 326/93, 95, 97, 326/98

(56) References Cited

U.S. PATENT DOCUMENTS

| | | | |
|---|---|---|---|
| 5,453,708 | * 9/1995 | Gupta et al. | 326/95 |
| 5,517,136 | 5/1996 | Harris et al. | 326/93 |
| 5,532,625 | 7/1996 | Rajivan | 326/98 |
| 5,543,735 | * 8/1996 | Lo | 326/93 |
| 5,550,490 | * 8/1996 | Durham et al. | 326/98 |
| 5,646,557 | * 7/1997 | Runyon et al. | 326/97 |
| 5,793,228 | * 8/1998 | Evans | 326/98 |
| 5,828,234 | * 10/1998 | Sprague | 326/98 |
| 5,986,475 | * 11/1999 | Kim et al. | 326/95 |
| 6,104,212 | * 8/2000 | Curran | 326/95 |

OTHER PUBLICATIONS

Daniel W. Dobberpuhl, et al., "200–MHZ 64–b Dual–Issue CMOS Microprocessor," (IEEE J. of Solid–State Circuits, vol. 27, pp. 1555–1565, Nov., 1992.
David Harris and Mark A, Horowitz, "Skew–Tolerant Domino Circuits," IEEE J. of Solid–State Circuit, vol. 32, No. 11, pp. 1702–1711, Jul., 1997.
Joel Silberman, et al., "A 1.0–GHz Singlel–Issue 64–bit PowerPC Integer Processor," IEEE J. of Solid–State Circuits, vol. 33, No. 11, pp. 1600–1608, Nov., 1998.

* cited by examiner

Primary Examiner—Michael Tokar
Assistant Examiner—Steven S. Paik
(74) Attorney, Agent, or Firm—Townsend and Townsend and Crew LLP

(57) ABSTRACT

A pipelined domino architecture includes pairs of pipeline stages each comprising a first active clocked stage and a number of subsequent self-reset logic gates. Each pipeline stage is clocked by one or the other of a clock signal. Each active clocked stage and self-reset logic gate of any particular pipeline state includes a reset circuit to reset the output of such stage or gate at the conclusion of an evaluation period that is initiated by a phase of the clock signal. Only the active clocked stage is clocked; the self-reset logic stages rely upon the reset of the output of the active clocked stage to generate the necessary reset signals that will reset their respective outputs.

17 Claims, 8 Drawing Sheets

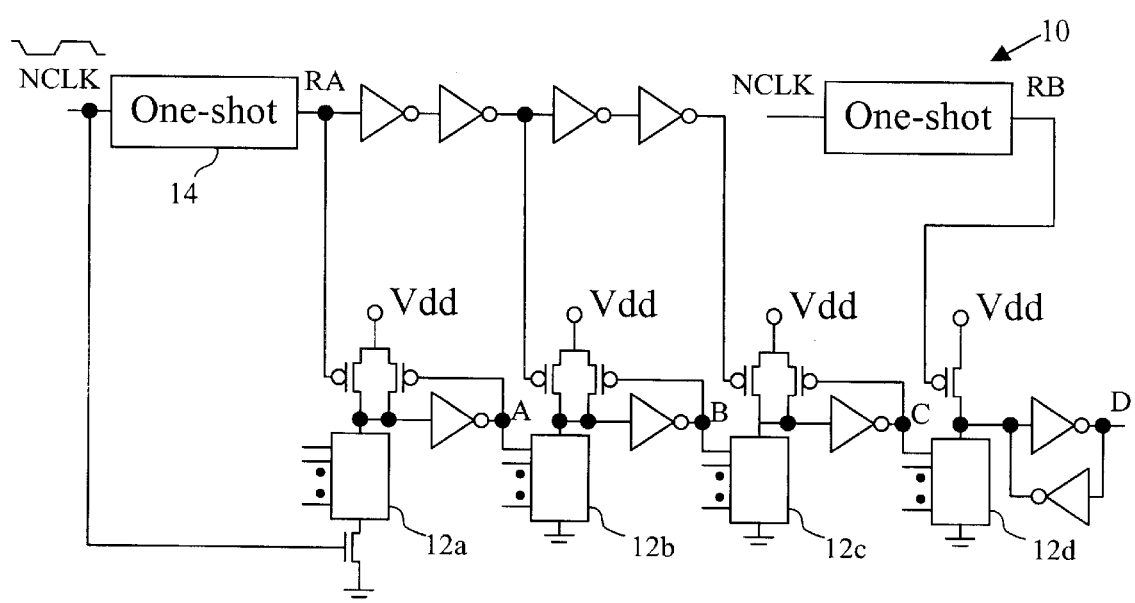
FIG_1A PRIOR ART

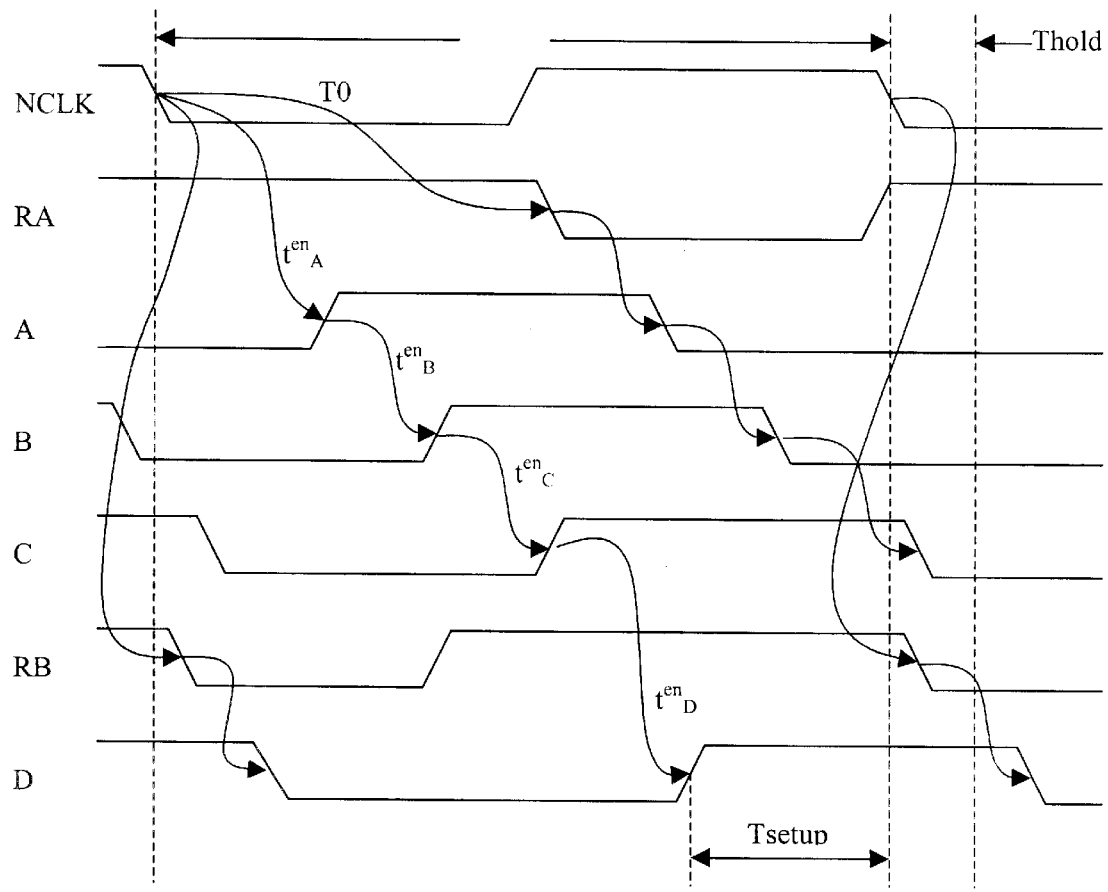
FIG_1B PRIOR ART

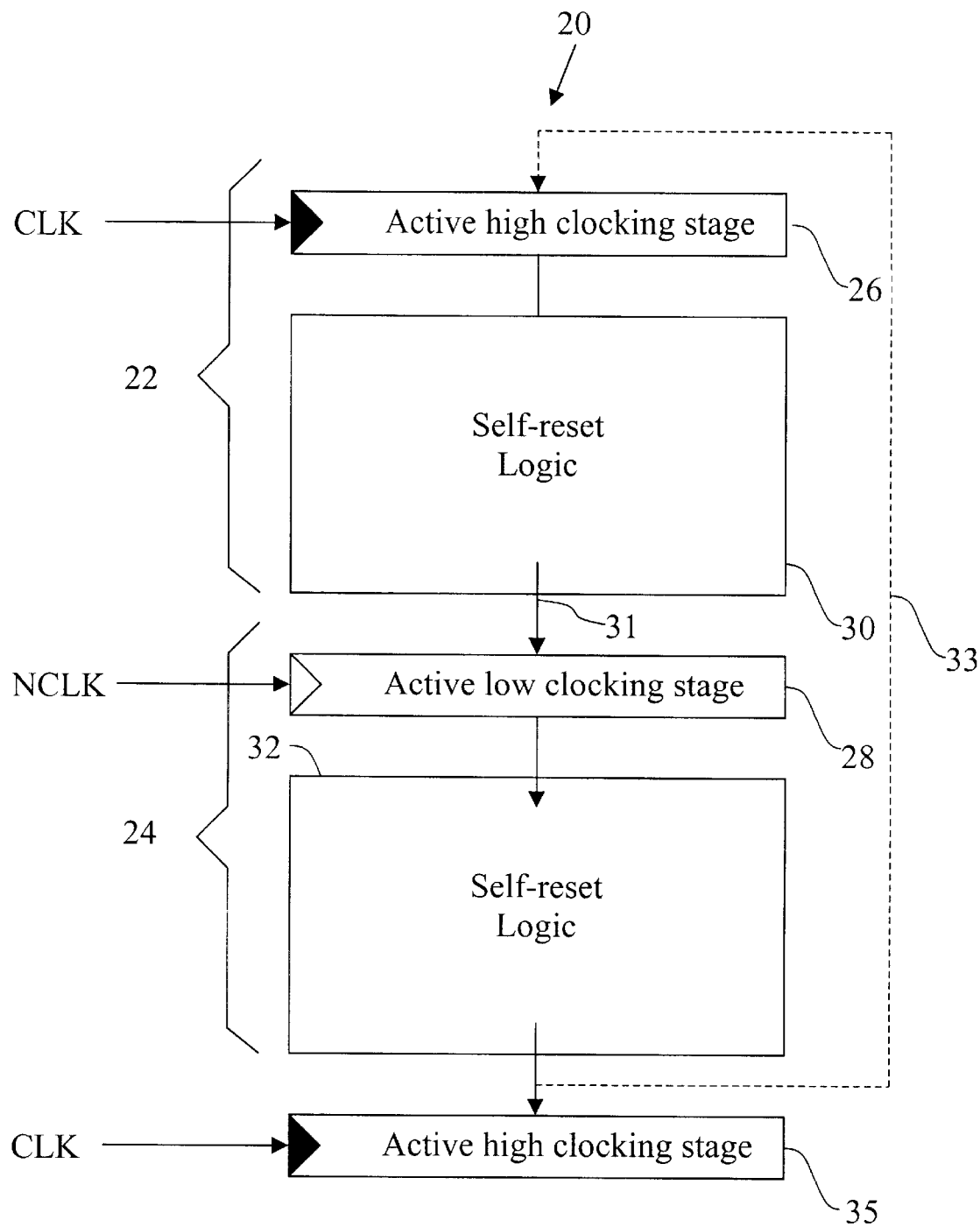
FIG_2A

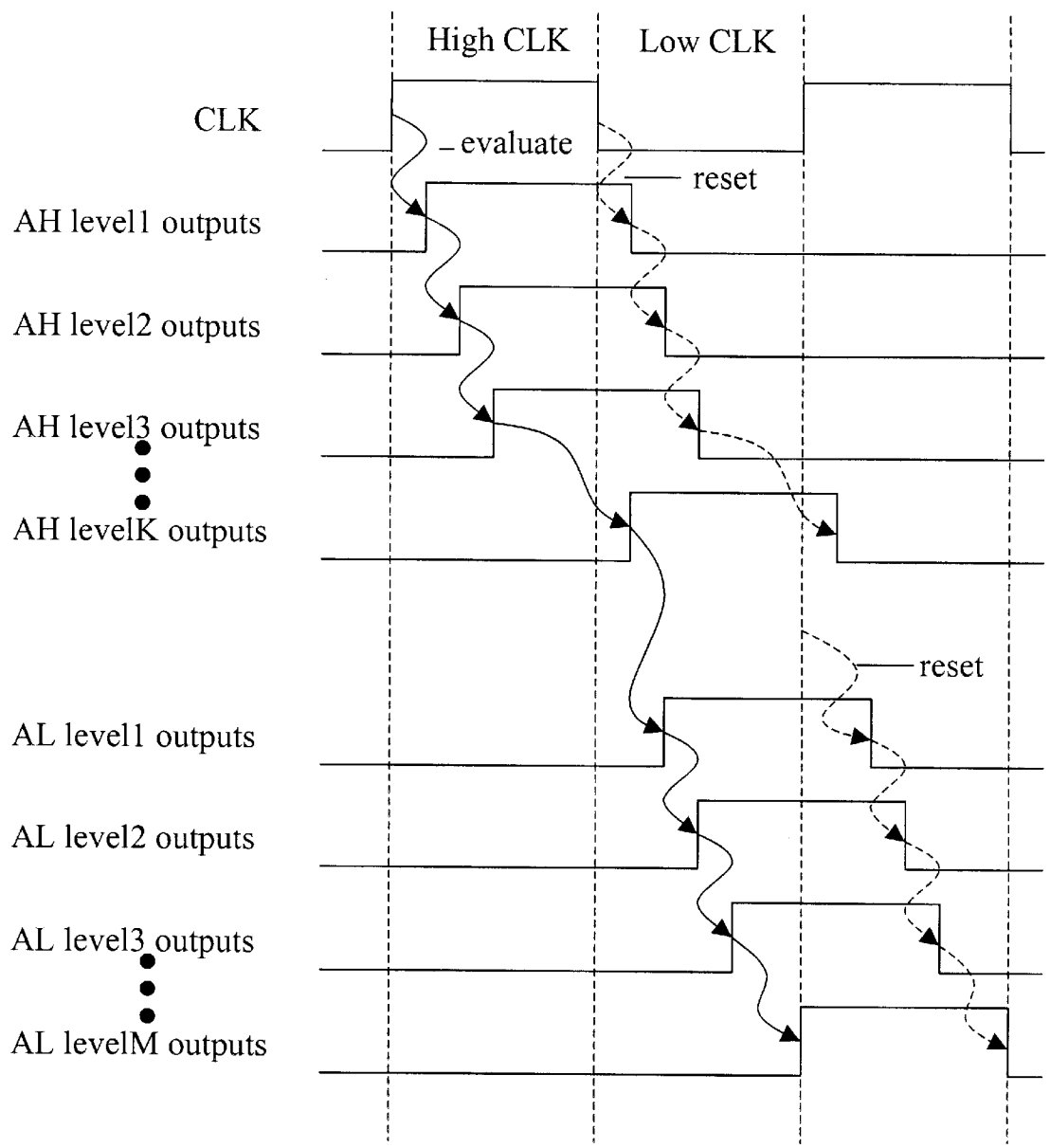
FIG2_B

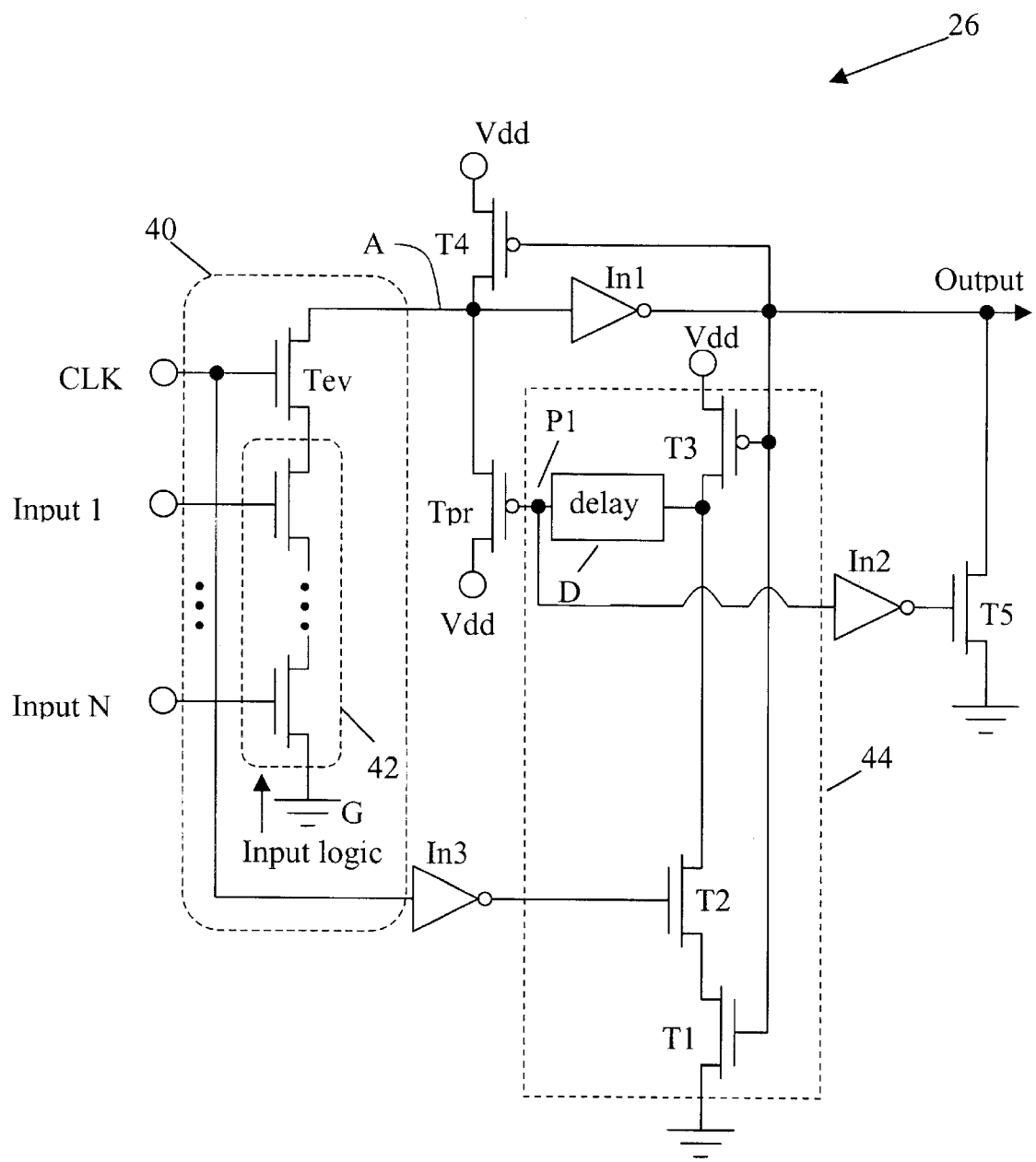
FIG_3A

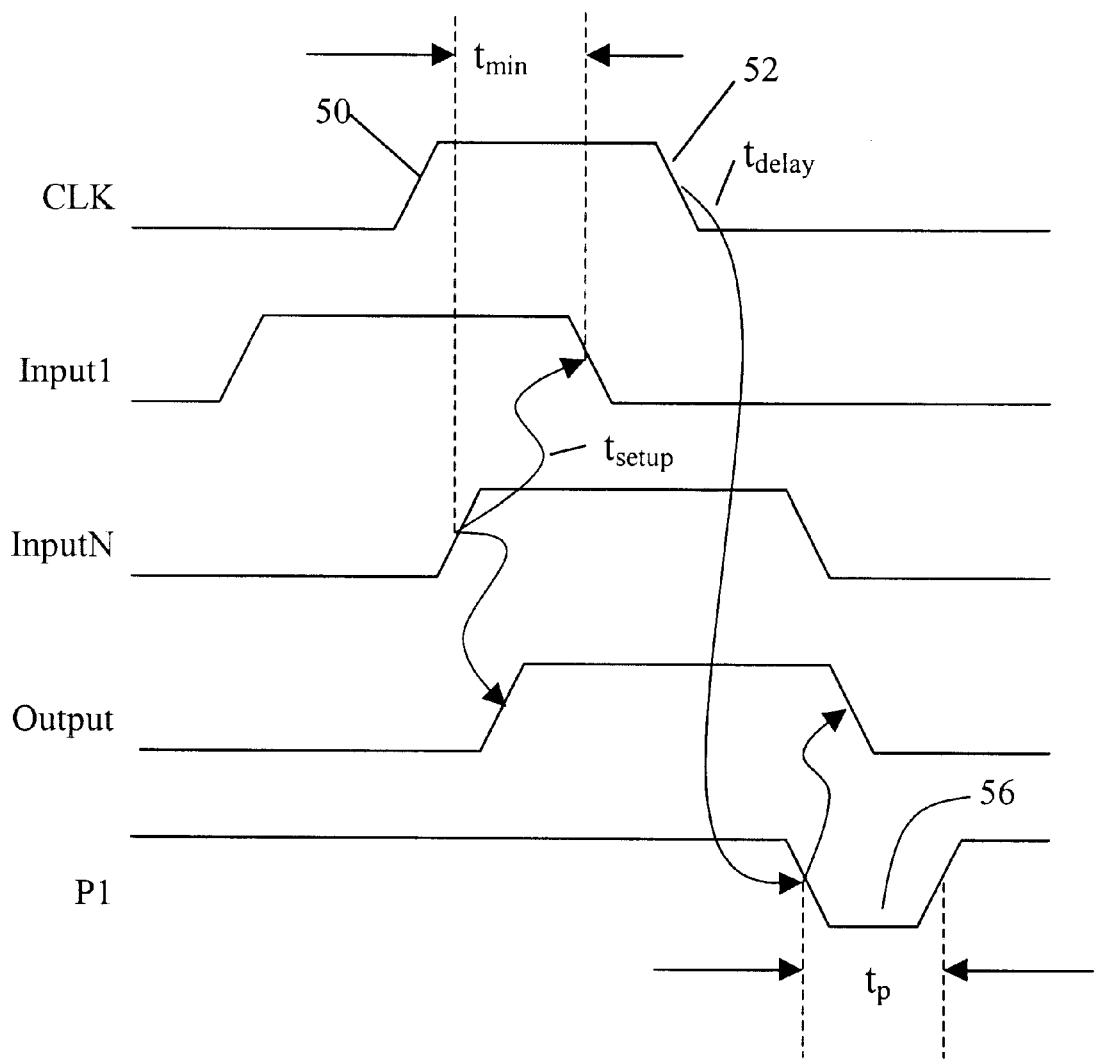
FIG_3B

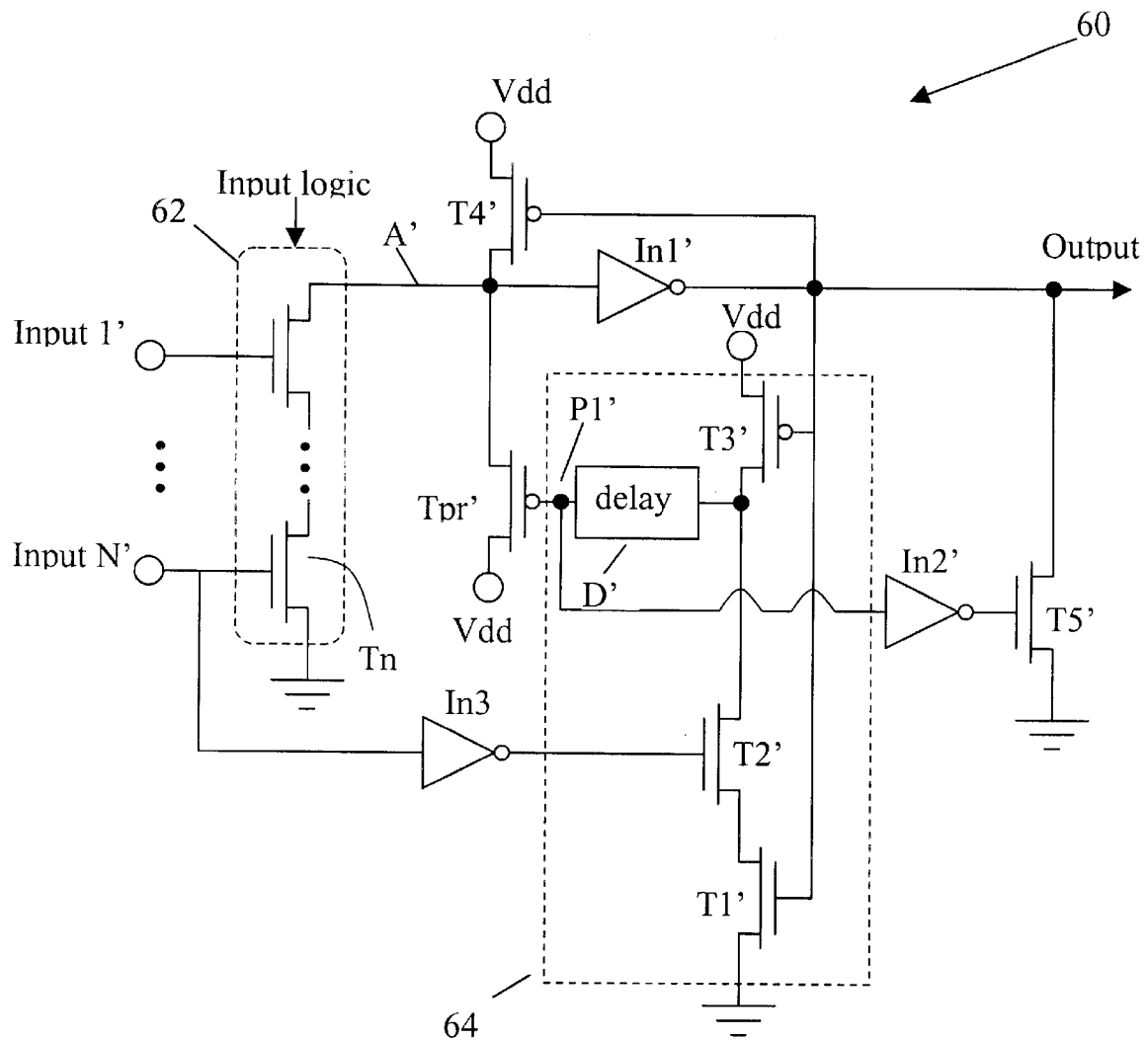
FIG_4A

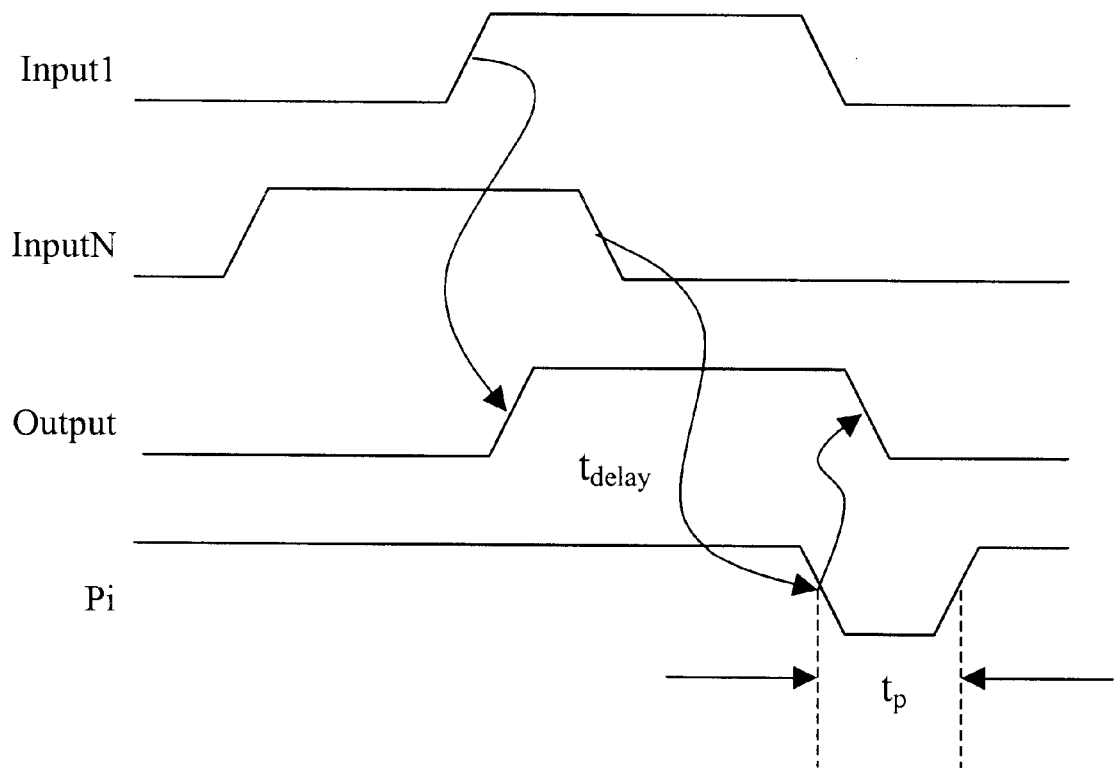
FIG_4B

EFFICIENT HALF-CYCLE CLOCKING SCHEME FOR SELF-RESET CIRCUIT

CROSS-REFERENCES TO RELATED APPLICATIONS

This application claims the benefit of U.S. Provisional Application No. 60/123,379, filed Mar. 8, 1999, the disclosure of which is incorporated by reference

BACKGROUND OF THE INVENTION

The present invention relates to CMOS logic circuits, and more particularly to a high speed, self-reset CMOS for wave propagation logic using a half-cycle clocking scheme.

For data processing environments requiring reduced power consumption, high noise immunity, competitive speeds and costs, or any of these requirements, CMOS has become the technology of choice. Unfortunately, CMOS is not without certain problems, one of which stems for the complementary nature of CMOS circuits. A typical CMOS input gate a p-channel device and an n-channel device, which can significantly raise the number of CMOS devices in any given design.

One solution to keeping the CMOS device count down is to use a form of clocked CMOS logic, conventionally referred to as "domino" logic. Domino logic provides low switching thresholds and reduced device count, leading to fast and area efficient circuit implementations. Thus, for high performance computing architectures, domino logic presents an attractive design style. Domino logic is capable of operating 1.5–2 times faster than static CMOS logic because the dynamic gates present a much lower input capacitance for the same output current, and have a slower switching threshold.

One conventional approach to the use of domino logic is to divide the logic into two pairs of logic groups, with each group being clocked by one or another of two phases of a clock signal. This approach permits one logic group to precharge, readying the logic of that phase circuit for the evaluation period, while the other logic group is in the evaluation period, developing an output signal based upon the evaluated inputs. Thus, rather than having all the gates of the two groups precharge at the same time, this approach tends to mask the precharge time from the critical path. With this approach, the minimum number of delays between latches is zero, and the maximum number of delays is constrained by the cycle time.

Domino logic does, however, have some disadvantages. The actual time for the operational phase of the logic is t=T−2 (tskew+tset.up), which is a waste of approximately 25% of the entire cycle. Also, a half cycle that is longer than expected due to process variations or modeling inaccuracies cannot borrow time from adjacent, less critical half cycles. Further, the latch hold time (thold) can create a problem since a fast clock edge and small clock skew are required. Another shortcoming is that since all domino circuits are clocked to switch them between the precharge and evaluation periods, there is presented thereby a substantial load on the clock circuit. This load, and the requirement for rapid clock switching (i.e. fast clock edges) can lead to a peak power supply current during the simultaneous precharge of all domino gates and, therefore, undesirably large power consumption.

One possible solution to these problems is the opportunistic time-borrowing skew-tolerant technique of domino circuit design, an example of which can be found in U.S. Pat. No. 5,517,136. This technique employs a complimentary domino logic design that achieves a performance increase of at least 25% by eliminating latches in the critical path, and allowing for opportunistic time borrowing across clock boundaries.

According to this technique, a pipeline of domino logic includes a plurality of logic gates controlled by multiple (i.e., four) clock signals. A first clock signal is a standard clock signal having an approximately 50% duty cycle. A second clock signal is the inverse of the first clock signal, while third and fourth clock signals are delayed versions of the first and second clock signals so that they have rising edges substantially synchronous with the rising edges of the first and second clock signals, but the falling edges are respectively delayed. The clock phases are arranged so that the edge of the clock signal that initiates the precharge phase is delayed in a way that allows the evaluation phase to continue into the subsequent half cycle, thereby accomplishing forward time-borrowing. An example of this approach can be found in U.S. Pat. No. 5,517,136

While the time-borrowing approach has its advantages, it is not without its disadvantages. First, there is the requirement of four separate clock signals, and the clock skew between these four clock signals is increased in comparison to that of the single clock signal. Also, the domino pipeline must comprise a first domino gate controlled by the first clock signal, a second domino gate controlled by the second clock signal, and so on. The minimum number of gates is two in a half-clock phase. Further, the requirement of four clock drivers increases power consumption. In addition, the time of the borrow (tbor) is limited in that it must be less than T/2−tp−2tskew−tsetup, where T is the cycle time, tsetup is the setup time of the last gate in a half cycle, tskew is the clock skew, and tp is the minimum time for the precharge of the domino gates. Today's fastest microprocessors are operating at cycle times below 18 fanout-of-four inverter (FO4) delays; the clock skew is 2FO4 delays. Setup time is 1.5 FO4 delays. The minimum time for precharge is 2FO4 delays. Thus, the tbor is only 1.5 FO4 delays. This time is not sufficient for the compensation of all clock skews. So this solution does not give the essential increase of clock frequency needed by high performance processors.

An alternate solution is based upon delayed or cascaded reset dynamic circuits. An example of this approach is shown in "A 1.0-GHz Single-Issue 64-bit Power PC Integer Processor," by J. Silverman, et al, IEEE J. of solid-state circuits, Vol. 33, No. 11, pages 1600–1608, November 1998, and is illustrated in FIGS. 1A and 1B. This solution employs a short chain 10 of CMOS logic gates, each including evaluation stage pulldown paths 12 (12a, 12b, . . . , 12d) that form the inputs for evaluation. During the evaluation period an output will be developed that depends upon the particular logic function implemented by the particular evaluation stage and its associated pulldown path 12. A global clock, NCLK, is used to enable the output of the cycle-bounding latch and launch a computation down the chain 10. If the logic equation represented by the pulldown path 12a is true, the precharged dynamic node will fall, and the output A of that logic stage will rise. This in turn may trigger the next gate in the chain 10, and computation propagates through the logic of the chain 10 to the macro output D. A one-shot circuit 14, triggered by the same clock edge of NCLK that launched the data from the latch produces a low-going pulse at some delay after NCLK falls. The delay is chosen such that if the output A rises in the next cycle, the output will be high long enough to robustly switch the next gate in the chain 10. This low-going pulse resets the first gate in the chain so that the output A falls. The reset pulse is propagated down the logic path through a chain of inverters, timed so that the reset signal is applied to each subsequent gate only after the inputs to the gate have returned to ground. The reset pulse must be long enough to ensure that the dynamic node returns fully to the power rail and short enough so that the reset signal is off before the next data input to the gate arrives.

The advantage of cascading the resets in this way is that most gates in the path can be built without a "foot" or ground interrupt device in the pulldown path of the evaluation state. This allows the device to be used as an extra logic element (e.g., input gate) in the pulldown path 12, or removed to obtain higher speed (at least 10%). Additionally, precharge current is drawn from the supply throughout the cycle rather than only at the clock edges, as is the case with conventional domino dynamic circuits, reducing peak current demand.

However, this solution has its drawbacks. One is that the actual time for the logic (t log) is T−(tskew+tset.up). This means that at least 10–15% of the entire cycle is wasted. Another problem is that all data paths must have equal delay so that the reset signal is off before the next data input to the gate arrives. In addition, a clock cycle, which is longer than expected, due to process variations or modeling inaccuracies, cannot borrow time from adjacent, less critical cycles. And, as the cycle time increases more than two times, operation of this circuit becomes erratic.

Thus, there is a need for a high speed, low power, low device count, domino logic circuit.

SUMMARY OF THE INVENTION

The present invention is a time-borrow, high speed self-reset logic that achieves higher clock frequencies with lower power consumption and clock loading, and reduced peak current demand.

Broadly, the invention relates to a two-phase domino logic chain or pipeline. Each phase of the logic pipeline is clocked by alternate phases of a global clock to define precharge and evaluation periods. Each pipeline phase includes a first domino logic gate that uses the global clock to launch a logic computation down that particular pipeline phase. The first domino logic gate includes a reset circuit to generate a reset signal at the conclusion of the evaluation period to reset the output of the logic gate to a predetermined state. The downstream logic gates of a particular pipeline phase receive, as one input thereto, the output of the first gate of that phase. The downstream logic gates of a pipeline phase do not receive a clock signal to establish precharge and evaluate periods. Rather, they rely upon the switching of state of the output signal from the first logic gate to initiate the evaluation and precharge periods. Each of the downstream logic gates also includes a reset stage, triggered by an edge of the output from the first logic gate, to initiate the precharge period and reset the output of the downstream gate to a state that allows following stages to be reset to a precharge state.

One advantage of the present invention is that only the first logic gate of each pipeline phase receives and uses the global clock signal. The remaining downstream logic gates of that pipeline phase rely on the switching of the first gate to initiate the evaluation period for that downstream gate, and to trigger the reset circuit for that gate to initiate the precharge period. Thus, device count is reduced, as is the loading on the global clock.

Also, if the output first logic gate of the pipeline phase does not change (e.g., the evaluated inputs are such that the output remains unchanged), there is no need for generation of a reset pulse, and power consumption is reduced.

These and other features and advantages of the present invention will become apparent to those skilled in this art upon a reading of the following description of the specific embodiments of the invention, which should be taken in conjunction with the accompanying drawings.

BRIEF DESCRIPTION OF THE DRAWINGS

FIGS. 1A and 1B are illustration of prior art domino logic and the timing diagram for that domino logic, respectively;

FIG. 2A is a block diagram of the a domino logic pipeline employing the present invention;

FIG. 2B is a timing diagram that illustrates operation of the domino logic pipeline of FIG. 2A FIG. 3A is a circuit diagram of a clocked, self-reset domino gate of the present invention;

FIG. 3B is a timing diagram for the circuit of FIG. 3A;

FIG. 4A is a circuit diagram of a self-reset gate used in downsteam domino logic of the block diagram of FIG. 2A; and FIG. 4B is a timing diagram for the circuit of FIG. 4A.

DESCRIPTION OF THE SPECIFIC EMBODIMENTS

Turning now to FIG. 2A, there is illustrated a domino logic pipeline 20 constructed according to the present invention. The logic pipeline 20, as shown, comprises two logic pipeline stages 22 and 24, and a third stage represented by the active high clocking stage 35. Each pipeline stage 22, 24 has an active, clocked stage 26, 28, respectively, followed by a number of self-reset stages 30, 32. The pipeline uses a global clock (CLK) to initiate the evaluation and precharge periods. The pipeline stage 22 uses CLK, and the pipeline stage 24 uses the inverse of CLK, or NCLK. (The CLK and NCLK signals are substantially identical, but 180 degrees out of phase from one another.) The active high clocking stage 35 receives the same clock signal as does the pipeline stage 22, i.e., CLK.

As the timing diagram of FIG. 2B shows, the rising edge of the CLK signal initiates the evaluation period of the pipeline stage 22, while at substantially the same time the NCLK signal initiates the precharge period for the pipeline stage 24. Depending upon the logic inputs to the active clocked stage 26 and the chain of individual gates making up the self-reset logic gates 30, the computations developed (indicated by the "AH level" outputs in FIG. 2B) will ripple through to the active clocking stage 28. At the conclusion of the evaluation period for the pipeline stage 22 (i.e., at the falling edge of the CLK signal) the next pipeline stage 24 will take the output 31 from the stage 30 and include it in the evaluation phase initiated with the rising edge of the NCLK signal.

Note, as the block diagram of FIG. 2A shows, only the active clocked stages 26 and 28 use a clock signal. As will be seen, the self-reset logic 30, 32 does not. The domino architecture of the present invention uses a single-phase clock which divided into alternated odd (High CLK) and even (Low CLK) half-cycle parts (FIG. 2B). The duty cycle of the global clock, CLK, is 50% so that the rising and falling edges of the phase defined by the CLK signal occur at substantially the same times as the falling and rising edges of the NCLK signal, respectively.

The signal line 33, shown in phantom in FIG. 24, illustrates the ability of taking the output of one domino logic pipeline stage as feedback to an upstream stage, as long as those stages are clocked by an alternate phase of the CLK (or NCLK) signal. Thus, as FIG. 2A illustrates, the output of the pipeline stage 24 (the computation of which is launched by the NCLK signal) can be fed back to any upstream pipeline stage that uses the CLK signal (e.g., pipeline stage 22).

FIG. 3A shows the construction of the active clocked stage 26. (The active clocked stage 28 is identical in construction so that the discussion of the active clocked stage 26 will apply equally to the active clocked stage 28.) As FIG. 3A shows, the active clocked stage 26 includes an evaluation stage 40 with an evaluate transistor Tev and input logic comprising a number of input transistors coupled to receive the CLK and input signals Input1, . . . InputN, respectively. The evaluate transistor Tev and input transistors (when all conducting) form a pulldown path between the node A and a potential G, which here is ground, although it may be some other potential. Node A is coupled to the Output through an inverter In1. A reset circuit, comprising the NMOS transistors T1 and T2, PMOS transistor T3, and a delay D control a precharge transistor Tpr.

The active clocked stage 26 operates in the following manner. When the CLK signal is LOW, the evaluate to transistor Tev is in a nonconductive state, and the node A is precharged to the supply voltage Vdd. With the rising edge 50 (FIG. 3B) of the CLK signal, the evaluate transistor Tev conducts, initiating the evaluation period of the active clocked stage 26. If the inputs to the input logic 42 are all evaluated true, the node A will be discharged to a LOW that is applied to the input of the inverter In1 to switch the Output from LOW to HIGH.

Later, the falling edge 52 of the CLK signal terminates the evaluation period by turning off the evaluate transistor Tev. This falling edge of CLK is applied as a HIGH to the gate lead of transistor T2 of the reset circuit 44 to place the transistor T2 in a conducting state. Since, at this time, the Output signal is HIGH (if all inputs to the input logic 42 were earlier true), the transistor T1 will also be in a conducting state. Accordingly, the transistors T1 and T2 will, after the time delay imposed by the delay D, discharge the node P1 to a LOW, turning on the precharge transistor Tpr, and charging node A. The discharge of the node P1 will, through the invertor In2, place the NMOS transistor T5 in conduction to pull the Output to a LOW, which in turn will turn off the transistor NMOS T1 and turn on the transistor PMOS T3 to charge the node P1 to Vdd.

The reset circuit 44 operated to generate an inverted reset pulse 56 (FIG. 3B) to the gate of the transistor T5 to reset the output. The active clocked stage 26 has now been reset to awaiting the next rising edge of the CLK signal. Note that if at least one of the inputs (Input1, . . . InputN) to the input logic 42 was not true during evaluation (the CLK signal LOW), the node A would not be discharged, and the Output would remain at a LOW. Since the active clocked stage 26 does not switch, the reset circuit 44 does not generate the reset pulse 56, and less power is thereby consumed. The PMOS transistor T4 keeps the node A in a charged state, and thereby (through the inverter In1) maintains a LOW on the Output.

The CMOS output structure of the output of the inverter In1 preferably designed to have a large PFET transistor and a very small NFET transistor to increase the speed of its LOW to HIGH transistions.

The second and all following (including last) self-reset logic gates of the the pipeline stages 30, 32 are constructed as shown in FIG. 4A. In FIG. 4A a self-reset logic gate, designated with the reference numeral 60, according to the present invention includes an input/evaluation stage 62. Note in particular that there is no enable-to-evaluate transistor Tev as was used in the active clocked stage 26. Rather, the Output of the active clocked stage 26, or a prior self-reset logic gate 60 of the pipeline stage 30 (or 32) if it receives the output of the active clocked stage 26, is used to reset the output of the gate 60. As did the active clocked stage 26, the self-reset gate 60 further includes a reset circuit 64 that will generate a reset pulse (P1') to turn on a pull down transistor T5' to reset the Output of the self-reset logic gate 60 to a LOW.

Operation of the self-reset gate 60 is as follows. One of the inputs Input 1', . . . , InputN' of the evalutaion/input logic 62 will receive the output of the active clocked stage for that particular pipeline stage; that is, if the gate 60 is a part of the selfrest logic 30 (FIG. 2A), it will receive as one of the inputs the Output of the active clocked stage 26, either directly or via another of the self-reset gates 60 of the stage 30.

Conversely, if the gate 60 is one of those contained in the self-reset logic 32, one of its inputs (Input1', . . . , Input N) which receive, directly or via another gate 60 of that logic, the Output of the active clocking stage 28. Assume such input is received at the InputN' of the evaluation/input logic 62, and that all other inputs to the evaluation/input logic are true. Thereby, during the evaluation phase, a discharge path is formed to discharge node A' to a LOW, switching the Output to a HIGH. Some time later, after the CLK signal (applied to the active high clocking stage 26 or 28, depending upon which logic 30, 32, the gate 60 is a member of) goes LOW, the reset circuit 44 of the upsteam active clocked stage 26, or 28 resets the Output to a LOW which will either be applied to the InputN directly or through upstream self-reset logic gates 60 that do receive the Output from active clocked stage 26. This will terminate the conduction of the input transistor Tn, but more importantly, the HIGH to LOW transistion of the Output of active clocked stage 26 will, via inverter In3, place transistor T2 in conduction. Since transistor T1' is already in conduction (because the Output of the self-rest logic 60 is HIGH), the node P1, after the delay D', is discharged to a LOW that (1) turns on the precharge transistor Tpr to charge the node A'. At the same time, the discharge of the node P1' will, through the inverter In2' and transistor T5', reset the Output of the self-reset logic gate 60 to a LOW, turning on the transistor T4' to maintain the node A' in a charged condition. The logic gate 60 has now been reset.

If, during the evaluation cycle encountered by the self-rest logic gate 60 did not have its InputN (i.e., the input that receives, directly or indirectly, the Output of the active clocked stage 26) see a LOW to HIGH transistion, or one of the other inputs was not evaluated as true, then the reset circuit does not generate the reset pulse and no power is consumed.

The global HIGH of the CLK signal gates the inputs of the first active clocked stage 26 to launch a computation down a logic path of the pipeline stage 22 (FIG. 2A). If the logic equation constructed for the evaluation/input logic of the active clocked stage 26 and the self-rest logic gates 60 (whose outputs are labeled "AH level 1-K outputs" in FIG. 2B) are true, the precharged dynamic node A (or A') will fall and respective outputs will rise. This, in turn, may trigger the next, downstream logic gates, and the computation propagates through the self-reset logic 30 to produce the macro outputs "AH level K output". If the clock half-cycle for the evaluation period is more then the evaluated delay of gates, then the outputs will hold their values until the next falling edge of the CLK signal. If the evaluated delay of the logic gates is more then the clock half-cycle of the evaluation period, then the inputs switch the outputs of the next successive active clocked stage (e.g., the active clocked stage 28, if we are talking about the pipeline stage 22) and the computation propagates through the self—reset logic 32 to produce the macro outputs—"AL level M output."

The reset wave begins at the falling edge of the CLK signal for the pipeline stage 22. The falling edge of the AH level 1 output (which correspond to the output of the active clocked stage 26) produces the reset to the self-rest logic gate that produces the AH level 2 output, and so on resetting each self-reset logic gate 60 in turn as indicated by the rippling falling edges of the AH level 2, level 3, . . . level K outputs of FIG. 2B. The AH level K output from the self-reset logic 30 completes the reset phase of half data path.

The reset wave of the pipeline stage 24 path begins with the rising edge of the CLK signal, which corresponds to the falling edge of the NCLK signal, and is completed by the rippling reset (to a LOW) of the AL level 1–AL level M outputs that are produce in the pipeline stage 24 by the active clocked stage 28 and self-reset logic gates 60 that make up the self-reset logic 32.

The self-reset gates 60 will operate correctly if two conditions are fulfilled:

First, all input signals (Input 1, . . . Input N') for each self-reset gate 60 must have the common time interval for the true operation tmin=tsetup. For example in the case of nonpipelined logic the input signals of AH clocking gate may appear at various moments (FIG. 4B). Signals to input 1 of a self-reset gate 60 can be applied directly from the output of an upstream self-reset gate 60 without intermediate logic levels. Signals to the InputN of any self-reset logic gate 60 may come after M levels of logic having delay more than half-cycle time.

Also , if the falling edge of an Input1 signal is delayed after the rising edge of the inputN signal:

tdelay=tmin+tskew+(tout.ALM−tout.AL1−T/2).

The maximum time interval which may be borrowed tbor= T/2−tskew−tsetup, that is the significantly best result with the comparison of know solution.

If the time borrow is used only for skew-tolerant, then t_delay of the active low-high clocking stages is equal for the nonpipelined logic circuits:

t_delay=tsetup+tskew−tout.AL1=tskew.

In the case of the "AL level M" outputs from the self-rest logic 30 being applied to the inputs of the active clocked stage 28 (FIG. 2A), the actual time available for logic is t log=T without any cycle time wasted.

In the case of a pipeline logic for the N clock cycle, the actual time for the logic evaluation is t log=(N*T) with time-borrowing possibility between the clock cycle.

The second condition is that the reset signal should be terminated before the next data input to the gate arrives.

The logic stages may be more complex with the dual-rail signals. In this case the reset circuit may be in the first clocking stage. The other logic circuits are reseted in the same manner as in Wave Propagation Logic [5].

As should now be evident to those skilled in this art, the proposed clocking scheme of the present invention combines a number of useful features in a pipeline domino logic circuit. First, is that only a single-wire global clock with 50% duty-cycle equal is used so that only a simple, low-power global clock distribution circuit is needed. Second,— maximizing the portion of clock cycle that is available to perform data processing, including the latchless design and time-borrow ability. Further, the use of a self-reset gate without having to rely upon a enable-to-evaluate transistors permits a higher speed of operation, lower device count, and lower power consumption per gate. In addition, the design of the gates according to the present invention reduces the peak power supply current during the precharge phase. Also, race problems are eliminated by the minimal delays through the logic stages and absence of clock skew. The gate design eliminates hold-time problems at the juncture of the adjacent half-cycles logic due to early reset and pulses skew. Finally, the logic chain may be fully non-pipelined for half-cycle part including the borrowing-time interval: the output signals of any preceding stage can be applied directly to the inputs of any following stages.

What is claimed is:

1. A domino logic circuit, including:

at least first and second domino stages connected in series, each of the first and second domino stages comprising, an active clocking stage having a first clocking stage output, a data input receiving a first data signal, and a clock input to receive a periodic signal that defines a precharge period and an evaluate period, the active clocking stage producing a first output state at the first clocking stage output during the evaluate period if the first data signal is a first state, and a reset circuit to reset the first output state to a second output state at the conclusion of the evaluate period;

at least one self-reset stage having an output, and inputs coupled to receive the first clocking stage output and a second data signal to produce at the output a first self-reset output state during the evaluation period if the first output state is received and the second data signal is of a predetermined state, and a second reset circuit to reset the first self-reset output state to a second self-reset output state;

a clock signal coupled to the clock input of the active clocking stage of the first domino stage as the periodic signal, and a complement of the clock signal coupled to the clock input of the active clocking stage of the second domino stage as the periodic signal.

2. The domino logic circuit of claim 1, wherein the output of the self-reset stage of the first domino circuit is coupled to the data input of the active clocking stage of the second domino stage.

3. The domino circuit of claim 1, wherein the output of the self-reset stage of the first domino stage is coupled to an input of the self reset stage of the second domino circuit.

4. The domino circuit of claim 1, including a third domino logic stage comprising:

an active clocking stage having a second clocking stage output, and at least one data input coupled to receive a third data output from the second domino stage and a clock input coupled to receive the clock signal and produce a third output state during the evaluate period if the third data input is of a predetermined state, and a reset circuit to reset the third active clocking stage state output to a fourth active clocking stage state at the conclusion of the evaluate;

at least one self-reset stage having an output and inputs coupled to receive a fourth data signal and the fourth active clocking stage state to produce at the output second output during the evaluation period if the data and additional data signals are of predetermined states, and a second reset circuit to reset the output to a second state if the active clocking stage output is reset to a second state.

5. The domino circuit of claim 1, the data input of the active clocking stage of at least the first domino stage receiving further data signals and being configured to implement a logic function to produce said first clocking stage state when the data signal and the further data signals are of predetermined states when the clock signal is defining the evaluate period.

6. The domino circuit of claim 1, each of the active clocking stages of the first and second domino stages including a data input for receiving a plurality of data signals and the clock signal, the data input being configured to implement a logic function to produce the first clocking stage state when the data signals are of predetermined states and the clock signal is defining the evaluate period.

7. Domino logic, comprising:
a clock signal and a complement of the clock signal each defining a precharge period and evaluate period;
a number of domino stages coupled in series, alternating ones of the number of domino stages receiving the clock signal, the other of the number of domino stages receiving the complement of the clock signal, each of the domino stages including,
an active clocking stage having a plurality of inputs, including a clock input, coupled to receive data signals and the clock signal or the complement of the clock signal, respectively, a first output, and a first reset circuit operating to produce a reset pulse at the output when the received data signals are a predetermined stated at the conclusion of the evaluate period, and
a plurality of self-reset stages having inputs coupled to receive at least an additional data signal and the output to produce a second output during the evaluation period if the data and additional data signals are of predetermined states, and a second reset circuit to reset the output to a second state if the active clocking stage output is reset to a second state.

8. A clocked logic circuit, comprising:
a clocked input stage coupled to receive a clock signal and a plurality of logic inputs, the clock signal having a first clock edge initiating an evaluation period and a second clock edge defining an end of the evaluation period;
an output stage coupled to the clocked input stage to produce an output signal of a first state if the plurality of logic inputs are at a predetermined state during the evaluation period; and
a reset stage including a first delay element coupled to receive the clock signal to produce a delayed second clock edge to generate therefrom a reset pulse that is coupled to the output stage to switch the output signal from the first state to a second state.

9. The clocked logic circuit of claim 8, including a self-reset logic circuit having inputs coupled to receive the output signal and at least one data signal, the self-reset logic circuit further comprising:
an output to switch from a first output state to a second output state when the output signal switches from the second state to the first state and the data signal is a predetermined value; and
a reset circuit including a second delay element coupled to receive the output signal to produce a delayed output signal that generates a reset signal when the delayed output signal switches from the first state to the second state, the reset signal being coupled to switch the output to the first output state.

10. The clocked logic circuit of claim 9, wherein the clocked input stage implements a logic function for the logic inputs.

11. The clocked logic circuit of claim 10, wherein the self-reset circuit includes an input circuit coupled to receive the output signal and the at least one data signal to implement a logic function to switch the output from the first output state to the second output state when the output signal switches from the second state to the first state and the data signal is a predetermined value.

12. The clocked logic circuit of claim 8, wherein the clocked input stage implements a logic function for the logic inputs.

13. A domino logic pipeline stage, comprising;
a clocked logic circuit, the clocked logic circuit including:
a clocked input stage coupled to receive a clock signal and a plurality of logic inputs, the clock signal having a first clock edge defining a start of an evaluation period and a second clock edge defining an end of the evaluation period;
an output stage coupled to the clocked input stage to produce an output signal of a first state if the plurality of logic inputs are at a predetermined state during the evaluation period; and
a reset stage including a first delay element coupled to receive the clock signal to produce a delayed second clock edge to generate therefrom a reset pulse that is coupled to the output stage to switch the output signal from the first state to a second state;
a self-reset logic circuit having inputs coupled to receive the output signal and at least one data signal, the self-rest logic circuit further comprising:
an output to switch from a first output state to a second output state when the output signal switches from the second state to the first state and the data signal is a predetermined value; and
a reset circuit including a second delay element coupled to receive the output signal to generate a reset signal when the delayed output signal switches from the first state to the second state, the reset signal being coupled to the output to switch the output signal to the second state.

14. The domino pipeline stage of claim 13 wherein the clocked input stage implements a logic function for the logic inputs.

15. The domino pipeline stage of claim 14, wherein the self-reset circuit includes an input circuit coupled to receive the output signal and the at least one data signal to implement a logic function to switch the output from the first output state to the second output state when the output signal switches from the second state to the first state and the data signal is a predetermined value.

16. Domino logic, comprising:
a clock signal and a complement of the clock signal each defining a precharge period and an evaluate period;
at least first and second domino stages coupled in series, the first domino stage receiving the clock signal, the second domino stage receiving the complement of the clock signal, each of the domino stages including,
an active clocking stage having a plurality of inputs, including a clock input, coupled to receive respectively data signals and the clock signal or the complement of the clock signal, an active clocking stage output, and a first reset circuit operating to produce a reset pulse at the active clocking stage output when the received data signals are a predetermined stated at the conclusion of the evaluate period; and a plurality of self-reset stages having inputs coupled to receive at least an additional data signal and the active clocking stage output to produce an output signal during the evaluation period if the additional data signals and the active clocking stage output are of predetermined states, and a second reset circuit to reset the output signal to a second state if the active clocking stage output is reset to a second state.

17. A domino logic circuit, including:

at least first and second domino stages connected in series, each of the first and second domino stages comprising, an active clocking stage having a first clocking stage output, a data input receiving a first data signal, and a clock input to receive a periodic signal that defines a precharge period and an evaluate period, the active clocking stage producing a first output state at the first clocking stage output during the evaluate period if the data signal is a first state, and a reset circuit to reset the first output state to a second output state at the conclusion of the evaluate period;

at least one self-reset stage having an output, and inputs coupled to receive the first clocking stage output and a second data signal to produce at the output a first self-reset output state during the evaluation period if the first output state is received and the second data signal is of a predetermined state, and a second reset circuit to reset the first self-reset output state to a second self-reset output state;

a clock signal coupled to the clock input of the active clocking stage of the first domino stage as the periodic signal, and a complement of the clock signal coupled to the clock input of the active clocking stage of the second domino stage as the periodic signal; and a third domino logic stage comprising:

an active clocking stage having a second clocking stage output, and at least one data input coupled to receive a third data output from the second domino stage and a clock input coupled to receive the clock signal and produce a third output state during the evaluate period if the third data input is of a predetermined state, and a reset circuit to reset the third active clocking stage state output to a fourth active clocking stage state at the conclusion of the evaluate;

at least one self-reset stage having an output and inputs coupled to receive a fourth data signal and the fourth active clocking stage state to produce at the output second output during the evaluation period if the data and additional data signals are of predetermined states, and a second reset circuit to reset the output to a second state if the active clocking stage output in reset to a second state.

\* \* \* \* \*

UNITED STATES PATENT AND TRADEMARK OFFICE
CERTIFICATE OF CORRECTION

PATENT NO.    : 6,323,688 B1
DATED         : November 27, 2001
INVENTOR(S)   : Andrew V. Podlesny and Alexander V. Malshin It is certified that error appears in the above-identified patent and that said Letters Patent is hereby corrected as shown below:

<u>Title page,</u>
Item [73], Assignee, change the assignee's address from "George Town (KY)" to
-- George Town (Grand Cayman Islands) --.

Signed and Sealed this

Tenth Day of September, 2002

Attest:

Attesting Officer

JAMES E. ROGAN
Director of the United States Patent and Trademark Office